(12) United States Patent
Amani et al.

(10) Patent No.: US 6,369,450 B1
(45) Date of Patent: Apr. 9, 2002

(54) METHOD OF PRODUCING MOUNTING STRUCTURE AND MOUNTING STRUCTURE PRODUCED BY THE SAME

(75) Inventors: Kazuyoshi Amani; Tsukasa Shiraishi; Yoshihiro Bessho, all of Osaka (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 0 days.

(21) Appl. No.: 09/482,103

(22) Filed: Jan. 13, 2000

(30) Foreign Application Priority Data

Jan. 14, 1999 (JP) ............................................. 11-007519

(51) Int. Cl.[7] .......................... H01L 23/48; H01L 23/52
(52) U.S. Cl. ........................ 257/778; 257/783; 257/737
(58) Field of Search ......................... 257/778, 783, 257/737, 738, 787; 438/613; 220/180.22

(56) References Cited

U.S. PATENT DOCUMENTS

| | | | |
|---|---|---|---|
| 6,100,114 A | * | 8/2000 | Milkovich et al. ........... 438/127 |
| 6,103,553 A | * | 8/2000 | Park ............................ 438/119 |
| 6,121,689 A | * | 9/2000 | Capote et al. ............... 257/783 |
| 6,137,183 A | * | 10/2000 | Sako ........................... 257/783 |
| 6,251,211 B1 | * | 6/2001 | Lake ........................... 257/783 |

FOREIGN PATENT DOCUMENTS

| | | | |
|---|---|---|---|
| JP | 64-61951 | * 3/1989 | ..................... 438/4 |
| JP | 6-275678 | 9/1994 | |
| JP | 8-162499 | 6/1996 | |
| JP | 10-22340 | 1/1998 | |
| JP | 00-299414 A | * 10/2000 | |

* cited by examiner

Primary Examiner—Jhihan B Clark
(74) Attorney, Agent, or Firm—McDermott, Will & Emery

(57) ABSTRACT

A mounting structure is formed by flip-chip mounting a semiconductor device onto a substrate. An electrical connecting portion of the semiconductor device is connected to an electrical connecting portion of the substrate by means of an electrically conductive adhesive. A region of the semiconductor device which is not involved in electrical connection is bonded to a region of the substrate which is not involved in electrical connection by means of an adhesive. A test of electrical properties is performed on the semiconductor device and the substrate which are connected to each other. If it is determined that the electrical properties are poor in the test, the semiconductor device is separated from the substrate after heating a bonding place of the adhesive up to a temperature higher than a glass transition point or a melting point of the adhesive. If it is determined that the electrical properties are good in the test, the semiconductor device and the substrate are sealed by means of a sealing resin.

6 Claims, 4 Drawing Sheets

METHOD OF PRODUCING MOUNTING STRUCTURE AND MOUNTING STRUCTURE PRODUCED BY THE SAME

BACKGROUND OF THE INVENTION

1. Field of the Invention

The present invention relates to a mounting structure produced by flip-chip mounting a semiconductor device such as an integrated circuit chip onto a substrate, and a method for producing the same.

2. Description of the Related Art

Heretofore, in mounting a semiconductor device onto input/output terminal electrodes of a circuit board, one often utilizes the wire bonding method by soldering. In recent years, however, owing to scale reduction of a package of the semiconductor device and increased number of connection terminals, an interval between the connection terminals is becoming narrower, making it more and more difficult to perform wire bonding by soldering.

Therefore, in recent years, a structure is proposed in which the semiconductor device such as an integrated circuit board chip is directly mounted on the input/output terminal electrodes of the circuit board for scale reduction and effective utilization of a mounting area.

Above all, a structure in which a semiconductor substrate is flip-chip mounted facedown on a circuit board is regarded as being a useful structure because a collective electrical connection can be established between the semiconductor device and the circuit board in addition to large mechanical strength after establishing connection.

Next, an example of the flip-chip mounting method will be described with reference to FIG. 5. First, bump electrodes 3 are formed on pad electrodes 2 of an IC board 1 constituting a semiconductor device 4 by a known method. Then, an electrically conductive adhesive 7 is supplied to input/output terminal electrodes 6 of a circuit board 5 to which the semiconductor device 4 is to be mounted or to the bump electrodes 3. Further, an adhesive 8 is applied to either one of the semiconductor device 4 and the circuit board 5. The adhesive 8 is disposed in a region which is located on a surface facing to the other (i.e. the rear surface of the semiconductor device 4 or the mounting surface of the circuit board 5) and which is not involved in electrical connection between the two.

After making the above-mentioned preparations, the semiconductor device 4 is disposed on the circuit board 5. At this time, the semiconductor device 4 is positioned so that the bump electrodes 3 face to the input/output terminal electrodes 6. Thereafter, the adhesive 7 and the electrically conductive adhesive 8 are cured. In this state, a test of electrical properties is performed on the semiconductor device 4 and the circuit board 5. If the test results are good, a sealing resin 10 is supplied to a connecting place or a gap between the semiconductor device 4 and the circuit board 5 for curing, thus completing a mounting structure 9.

In recent years, in the field of mounting, in accordance with scale reduction and weight reduction of electronic equipments, a multi-chip module (hereafter referred to as MCM) is proposed in which a plurality of semiconductor devices are flip-chip mounted onto a circuit board to form a module. In such an MCM, all of the plurality of semiconductor devices operate to function as one module. For this reason, in the mounting structure 9 constituting the MCM, the following point is of importance in terms of the costs and the good-product ratio of the mounting structure and the yield in the mounting process.

Whether the semiconductor device 4, whose electrical properties are found to be poor in an electrical property test conducted before sealing with a sealing resin 10, can be replaced easily or not, i.e. the repairability of the semiconductor device 4, is important.

However, according to the conventional method, the electrical property test is conducted on the semiconductor device 4 and the circuit board 5 after the adhesive 7 is cured. Therefore, if the test results are found to be poor, the poor one is peeled off from the other one against a bonding force of the adhesive 7. For this reason, fragments of the poor one often adhere to the other reutilizable one, making it substantially impossible to reutilize the other one.

SUMMARY OF THE INVENTION

Accordingly, a major object of the present invention is to reduce the costs and to increase the good-product ratio and the yield by improving the repairability of the mounting structure.

In order to achieve the aforementioned object of the present invention, the first one of the present invention is directed to a method of producing a mounting structure comprising: a connecting step of flip-chip mounting a semiconductor device onto a substrate; a bonding step of bonding a region of said semiconductor device to a region of said substrate by means of an adhesive, each of said regions not being involved in electrical connection; a testing step of performing a test of electrical properties on said semiconductor device and said substrate that are connected to each other; and a separating/sealing step of separating said semiconductor device from said substrate after heating a bonding place of said adhesive up to a temperature higher than a glass transition point or a melting point of said adhesive if it is determined that said electrical properties are poor in said testing step, and sealing said semiconductor device and said substrate by means of a sealing resin if it is determined that said electrical properties are good in said testing step.

This allows the testing step to be carried out in a state in which the semiconductor device and the substrate are firmly bonded to each other by the adhesive, so that the electrical properties of the semiconductor device and the substrate can be tested with high precision. Furthermore, the adhesive can be brought into a softened state if a heating process performed in the case where the electrical properties are found to be poor, i.e. a process of heating a bonding place of the adhesive up to a temperature above the glass transition point or the melting point of the adhesive, is carried out. If the semiconductor device is separated from the substrate in this state, separation of the semiconductor device from the substrate can be carried out easily without causing damages to the semiconductor substrate or the substrate.

In the present invention, an electrically conductive adhesive used in said connecting step preferably comprises a thermoplastic resin. This reduces the possibility of damaging an electrical connecting portion of the semiconductor device and an electrical connecting portion of the substrate in separating the semiconductor device from the substrate because the electrically conductive adhesive comprising the thermoplastic resin has a comparatively low bonding strength. Here, by using an electrically conductive adhesive comprising a thermoplastic resin, it is feared that the electrical property test of the semiconductor and the substrate will be unreliable in the testing step. However, in the present invention, since the testing step is carried out after allowing the semiconductor device and the substrate to be bonded to each other comparatively firmly by the adhesive in the bonding step, there is no fear that the electrical property test of the semiconductor and the substrate will be unreliable in the testing step.

In the present invention, the adhesive used in the bonding step preferably comprises a thermosetting resin. This allows the testing step to be carried out after more firmly bonding the semiconductor device and the substrate to each other by the adhesive in the bonding step, because the thermosetting resin is an adhesive having a comparatively high bonding strength. Therefore, reliability of the electrical property test in the testing step is further improved.

In the present invention, the adhesive is preferably cured at a temperature lower than the glass transition point of the adhesive in the bonding step. This allows the adhesive to be softened at a temperature lower than the inherent glass transition point of the adhesive, thereby lowering the temperature for a heating process carried out in the separating/sealing step (the temperature at which the adhesive is brought into a state similar to the state of glass transition) to facilitate the process.

In the present invention, the adhesive used in the bonding step preferably comprises a low melting point metal. This allows the testing step to be carried out after more firmly bonding the semiconductor device and the substrate to each other by the adhesive in the bonding step, whereby the reliability of the electrical property test in the testing step is further improved.

In the present invention, if it is determined that the electrical properties are poor in the testing step, the semiconductor device is separated from the substrate preferably by applying a torsional force to the adhesive in the separating/sealing step. This allows the step of separating the semiconductor device from the substrate, which step is performed as a next step after the electrical properties are found to be poor, to be carried out reliably and with a comparatively small force.

The second one of the present invention is directed to a method of producing a mounting structure comprising: a connecting step of flip-chip mounting a semiconductor device onto a substrate; a bonding step of bonding a region of said semiconductor device to a region of said substrate by means of an adhesive, each of said regions not being involved in electrical connection; a peeling permitting layer forming step of forming a peeling permitting layer on an adhesive abutting region of said semiconductor device and/or an adhesive abutting region of said substrate, said peeling permitting layer forming step being performed before said bonding step; a testing step of performing a test of electrical properties on said semiconductor device and said substrate that are connected to each other; and a separating/sealing step of separating said semiconductor device from said substrate if it is determined that said electrical properties are poor in said testing step, and sealing a gap between said semiconductor device and said substrate by means of a sealing resin if it is determined that said electrical properties are good in said testing step.

This allows the testing step to be carried out in a state in which the semiconductor device and the substrate are firmly bonded to each other by the adhesive, so that the electrical properties of the semiconductor device and the substrate can be tested with high precision. Furthermore, if it is determined that the electrical properties are poor in the testing step, the peeling permitting layer allows the semiconductor device and the substrate to be separated from each other easily without leaving a residue to the other one of the semiconductor device and the substrate and without causing damages to each other.

The peeling permitting layer may be, for example, a fluororesin layer or a layer having a bonding force that weakens by a predetermined process. Examples of the layer having a bonding force that weakens by a predetermined process include a substance having a bonding force that weakens by swelling through reaction with a solvent, a substance having a bonding force that weakens by foaming through a heating process, and a substance having a glass transition point or a melting point lower than the adhesive.

As described above, the present invention allows a repairing work to be carried out without causing damages to the place involved in the electrical connection.

In addition, by further forming a peeling permitting layer, the repairing work can be carried out without leaving a residue of the adhesive, so that the semiconductor device and the circuit board can be reutilized without a cleaning process after the repairing work.

Furthermore, the force needed in the repairing work can be reduced to half by applying a torsional force after forming the adhesive at a single position.

BRIEF DESCRIPTION OF THE DRAWINGS

The above and further objects of the invention will be apparent from the following detailed description of preferred embodiments and will be precisely indicated in the appended claims, and numerous other advantages which are not touched upon in the specification will be recalled to those skilled in the art in reducing the present invention into practice with reference to the accompanying drawings in which.

DETAILED DESCRIPTION OF THE INVENTION

Hereafter, preferable embodiments of the present invention will be described with reference to the attached drawings.

(Embodiment 1)

Figure 1A:
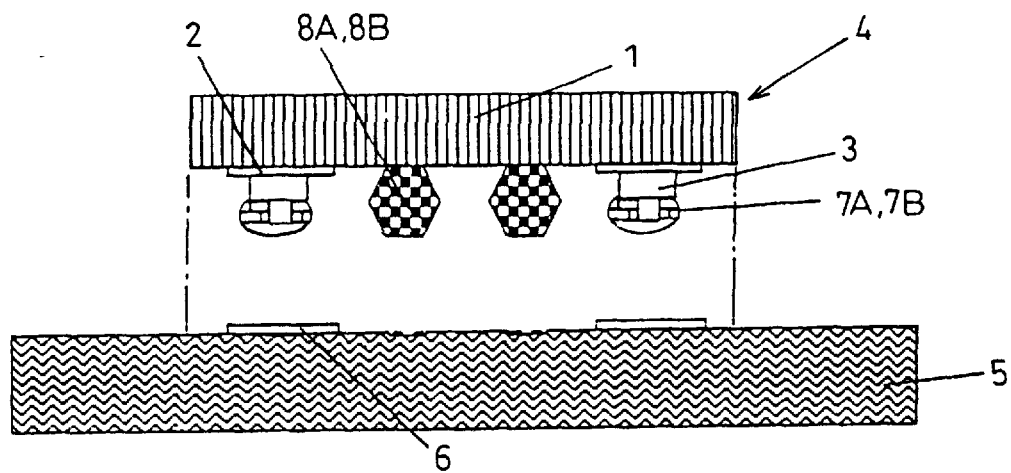
FIGS. 1A and 1B are schematic section views showing steps for producing mounting structures as embodiments 1, 2, and 3 of the present invention.

First, referring to FIG. 1A, bump electrodes 3 are formed by a known method on electrode pads 2 of an IC board 1 constituting a semiconductor device 4 to form electrical connecting points thereof. Then, an electrically conductive adhesive 7A comprising a thermoplastic resin having a low bonding strength is supplied to either the bump electrodes 3 or input/output terminal electrodes 6 of a circuit board 5 which is a substrate on which the semiconductor device 4 is to be mounted. In FIG. 1A, the electrically adhesive 7A is supplied to the bump electrode 3 side. Further, an adhesive 8A composed of a thermosetting resin having a high bonding strength is supplied to either a region of the semiconductor device 4 which is not involved in electrical connection or a region of the circuit board 5 which is not involved in electrical connection (a rear surface of the semiconductor device 4 or a mounting surface of the circuit board 5). In FIG. 1A, the adhesive is supplied to the semiconductor device 4 side. As a supplying method, an adhesive 8A in a liquid state may be supplied by means of a dispenser or alternatively an adhesive 8A made into a film may be supplied by the transfer method or the like.

Subsequently, the semiconductor device 4 is flip-chip mounted onto the circuit board 5 by a known method, and further the electrically conductive adhesive 7A and the adhesive 8A are cured to form a provisional mounting structure 9'.

Figure 1B:
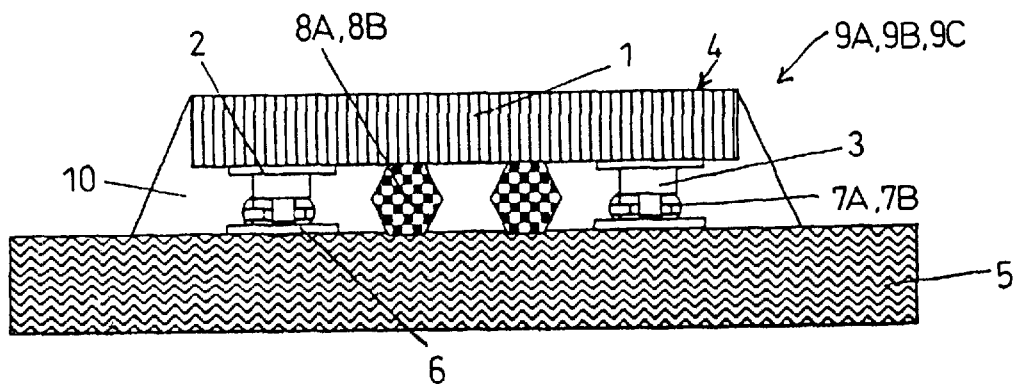

Then, a test of electrical properties is conducted on the provisional mounting structure 9' and, if good results are obtained, a sealing resin 10 is injected into a gap between the semiconductor device 4 and the circuit board 5 for curing, thereby completing a mounting structure 9A (See FIG. 1B).

On the other hand, if the electrical properties of the semiconductor device 4 or the circuit board 5 are found to be poor, the following process is carried out. Here, it is assumed that the electrical properties of the semiconductor device 4 are found to be poor. However, the same applies if the electrical properties of the circuit board 5 are found to be poor.

A bonding place of the adhesive 8A is heated up to a temperature above a glass transition point $PG_{8A}$ of the adhesive 8A, thereby to soften the adhesive 8A. Here, it is preferable to selectively heat the adhesive 8A in order to prevent thermal damages to the other portion by heating. The selective heating process can be performed, for example, by blowing a hot air with a nozzle having a microaperture.

In a state in which the adhesive 8A is softened by heating, the semiconductor device 4 is separated from the circuit board 5. Then, another semiconductor device 4 is mounted onto the circuit board 5 by a method similar to the above-described one, thereby performing a repairing work. Further, the test of electrical properties is conducted on the provisional mounting structure 9' again and, if good results are obtained, a sealing resin 10 is injected into a gap between the semiconductor device 4 and the circuit board 5 for curing. On the other hand, if good results are not obtained, the above-described repairing work is carried out again.

In embodiment 1, since an electrically conductive thermoplastic adhesive having a low bonding strength is used as the electrically conductive adhesive 7A, damages by repairing are not generated in the connecting region which is involved in electrical connection and is important in reutilization, thus making it possible to reutilize the semiconductor device 4 and the circuit board 5.

Moreover, since the semiconductor device 4 and the circuit board 5 are comparatively firmly bonded to each other by the adhesive 8A composed of a thermosetting resin having a higher bonding strength than the electrically conductive adhesive 7A, the electrical connection between the bump electrodes 3 and the input/output terminal electrodes 6 in the testing step is made firm, thereby leading to a high accuracy in testing.

Also, by raising the temperature above the glass transition temperature ($PG_{8A}$) of the adhesive 8A in the repairing work, the semiconductor device can be separated from the circuit board 5 after lowering the bonding strength of the adhesive 8A, so that the two can be separated from each other easily.

Here, in embodiment 1, the test of electrical properties can be conducted after performing a curing process at a temperature lower than the glass transition point $PG_{8A}$ of the adhesive 8A to allow the adhesive 8A to be in an incompletely cured state. In this case also, the adhesive 8A can exhibit a bonding strength on the semiconductor device 4 and the circuit board 5 to such a degree that the subsequent test can be conducted with a sufficiently high precision. If the adhesive 8A is subjected to an incomplete curing process at a temperature lower than the glass transition point $PG_{8A}$ of the adhesive 8A, the adhesive 8A is brought into a softened state in a temperature region lower than the glass transition point $PG_{8A}$. Therefore, the heat processing temperature needed in the separation step for repairing can be controlled to be low, thereby providing an advantage that the repairing work can be facilitated.

If such an incomplete curing process is performed, a further curing process can be performed to bring the adhesive 8A into a completely cured state after the test of the electrical properties turns out to be good. This allows the final curing process to be carried out simultaneously with the process of curing the sealing resin 10.

(Embodiment 2)

In embodiment 2, a mounting structure 9B is produced basically in the same manner as in embodiment 1, except the following difference.

An electrically conductive adhesive 7B comprising a thermosetting resin is used, and the glass transition point $PG_{7B}$ of the thermosetting resin constituting the electrically conductive adhesive 7B is set to be higher than the glass transition point $PG_{8A}$ of the adhesive 8A (thermosetting resin) ($PG_{8A} < PG_{7B}$)

A provisional curing process is carried out at the following processing temperature T1 on the electrically conductive adhesive 7B and the adhesive 8A supplied to desired portions between the semiconductor device 4 and the circuit board 5. Namely, a heating process is carried out at a processing temperature T1 which is higher than the glass transition point $PG_{8A}$ of the adhesive 8A and which is lower than the glass transition point $PG_{7B}$ of the electrically conductive adhesive 7B ($PG_{8A} < T1 < PG_{7B}$). This process allows the adhesive 8A to be cured almost completely while allowing the electrically conductive adhesive 7B to be cured incompletely.

If the test on the electrical properties turns out to be poor, the bonding place of the adhesive 8A is heated to a temperature region above the glass transition point $PG_{8A}$ of the adhesive 8A. This process softens the adhesive 8A before separating the semiconductor device 4 from the circuit board 5.

If the test on the electrical properties turns out to be good, the adhesive 8A is subjected to a complete curing process.

In embodiment 2, the repairing work is carried out while maintaining the electrically conductive adhesive 7B in an incompletely cured state, so that there will be almost no damages caused by the repairing work to the region that is involved in the electrical connection and is important at the time of reutilization, thereby leading to a higher efficiency of reutilizing the semiconductor device 4 or the circuit board 5.

(Embodiment 3)

In embodiment 3, a mounting structure 9C is produced basically in the same manner as in embodiment 1, except that an adhesive 8B composed of a solder is used. Hereafter, the method of producing the mounting structure according to embodiment 3 will be described with reference to FIGS. 1A and 1B.

An electrically conductive adhesive 7A is supplied to either the input/output terminal electrodes 6 of the circuit board 5 or the bump electrodes 3 of the semiconductor device 4. In FIG. 1A, the electrically conductive adhesive 7A is supplied to the bump electrode 3 side. The electrically conductive adhesive 7A comprises a thermoplastic resin having a low bonding strength.

An adhesive 8B composed of a solder is supplied to either a region of the semiconductor device 4 which is not involved in electrical connection or a region of the circuit board 5 which is not involved in electrical connection (a rear surface of the semiconductor device 4 or a mounting surface of the circuit board 5). In FIG. 1A, the adhesive 8B is supplied to the semiconductor device 4 side. Subsequently, the semiconductor device 4 is flip-chip mounted to the circuit board 5 by a known method, and further a reflow process is carried out after the flip-chip mounting so as to perform joining with the adhesive 8B composed of the solder.

A test of electrical properties is conducted on a provisional mounting structure 9' thus prepared and, if good results are obtained, a sealing resin 10 is injected into a gap between the semiconductor device 4 and the circuit board 5 for curing to form a mounting structure 9C.

On the other hand, if the electrical properties of the semiconductor device 4 or the circuit board 5 are found to be poor in the electrical property test, the following process is carried out. Here, it is assumed that the electrical properties of the semiconductor device 4 are found to be poor. However, the same applies to the case in which the electrical properties of the circuit board 5 are found to be poor. Namely, the bonding place of the adhesive 8B is heated to a temperature region in which the adhesive 8B is melted. After softening the adhesive 8B through this process, the semiconductor device 4 determined as being poor is separated from the circuit board 5. Then, another semiconductor device 4 is mounted onto the circuit board 5 by a method similar to the above-described one, thereby performing a repairing work. Further, the test of electrical properties is conducted on the provisional mounting structure 9' again and, if good results are obtained, a sealing resin 10 is injected into a gap between the semiconductor device 4 and the circuit board 5 for curing, thereby to form the mounting structure 9C. On the other hand, if good results are not obtained, the above-described repairing work is carried out again.

In embodiment 3, the thermoplastic electrically conductive adhesive 7A having a lower bonding strength is used as a member for aiding the electrical conduction, and also the adhesive 8B composed of a solder, which is a low melting point metal, is used at a place which is not involved in electrical conduction effects. Therefore, the semiconductor device 4 or the circuit board 5 can be reutilized without giving damages to the region involved in the electrical connection in the repairing work. Further, since the adhesive 8B is made of a solder, the mounting process can be carried out again without cleaning the solder.

(Embodiment 4)

Figure 2A:
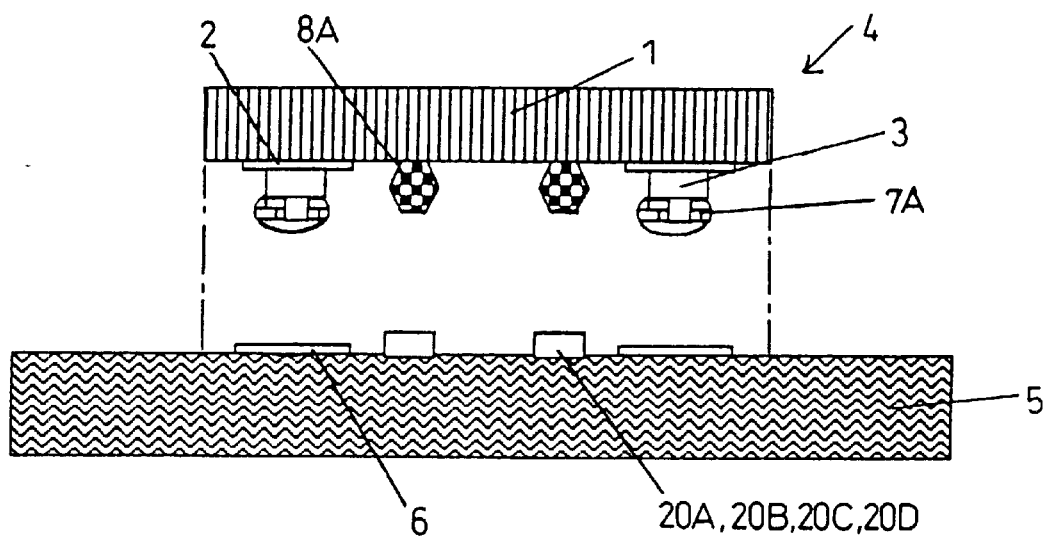
FIGS. 2A and 2B are schematic section views showing steps for producing mounting structures as embodiments 4, 5, 6, and 7 of the present invention.

Referring to FIG. 2A, bump electrodes 3 (electrical connecting points) are formed by a known method on electrode pads 2 of an IC board 1 constituting a semiconductor device 4. Then, a fluororesin layer 20A is formed in a region which is not involved in electrical conduction and which is located on at least one of the semiconductor board 4 and a circuit board 5 for mounting the semiconductor device 4 thereon. In FIG. 2A, the fluororesin layer 20A s formed on the circuit board 5 side. The fluororesin layer 20A serves to weaken the bonding force of an adhesive used in bonding the circuit board 5 and the semiconductor board 4.

Thereafter, an electrically conductive adhesive 7A is supplied onto either one of input/output terminal electrodes 6 of the circuit board 5 and the bump electrodes 3 of the semiconductor device 4. In FIG. 2A, the electrically conductive adhesive 7A is supplied to the bump electrode 3 side. The electrically conductive adhesive 7A comprises a thermoplastic resin having a low bonding strength.

Further, an adhesive 8A is supplied onto either one of the fluororesin layer 20A of the circuit board 5 and a rear surface of the semiconductor device 4 facing the fluororesin layer 20A. In FIG. 2A, the adhesive 8A is supplied to the semiconductor device 4 side. The adhesive 8A comprises a thermosetting epoxy resin having a high bonding strength. As a supplying method, an adhesive 8A in a liquid state may be supplied by means of a dispenser or alternatively an adhesive 8A made into a film may be supplied by the transfer method or the like.

Subsequently, the semiconductor device 4 is flip-chip mounted onto the circuit board 5 by a known method. At this time, the adhesive 8A abuts the fluororesin layer 20A to be bonded thereto. Then, the electrically conductive adhesive 7A and the adhesive 8A are cured to form a provisional mounting structure 9'. In embodiment 4, electrical connection between the semiconductor device 4 and the circuit board 5 is established by means of an electrically conductive thermoplastic adhesive 7A having a low bonding strength. However, it is also effective to use an electrically conductive adhesive comprising a thermosetting resin having a lower strength than the adhesive 8A.

An electrical property test is conducted on the above-mentioned provisional mounting structure 9' and, if good results are obtained, a sealing resin 10 is injected into a gap between the semiconductor device 4 and the circuit board 5 for curing. This completes a mounting structure 9D (See FIG. 2B).

On the other hand, if the electrical properties of the semiconductor device 4 or the circuit board 5 are found to be poor, the next process is carried out. Here, it is assumed that the properties of the semiconductor device 4 are found to be poor. However, the same applies if the electrical properties of the circuit board 5 are found to be poor.

The semiconductor device 4 is separated from the circuit board 5 after heating a neighborhood of the fluororesin layer 20A to a temperature region which is lower than the glass transition point $PG_{8A}$ of the adhesive 8A.

Then, another semiconductor device 4 is mounted onto the circuit board 5 by a method similar to the above-described one, thereby performing a repairing work. Further, the test of electrical properties is conducted again and, if good results are obtained, a sealing resin 10 is injected into a gap between the semiconductor device 4 and the circuit board 5 for curing. This completes a mounting structure 9A. On the other hand, if good results are not obtained, the above-described repairing work is carried out again.

In embodiment 4, since an electrically conductive adhesive 7A comprising a thermoplastic resin and having a low bonding strength is used at the connecting portion having an electrical connection, damages are not generated by repairing in the region which is involved in electrical connection and is important in reutilization, thus making it possible to reutilize the semiconductor device 4 or the circuit board 5.

Further, since the fluororesin layer 20A is formed, it is possible to perform a repairing work without leaving a residue of the adhesive 8A at the time of repairing. Furthermore, since there is no residue, the semiconductor device 4 or the circuit board 5 can be reutilized without cleaning.

(Embodiment 5)

Figure 2B:
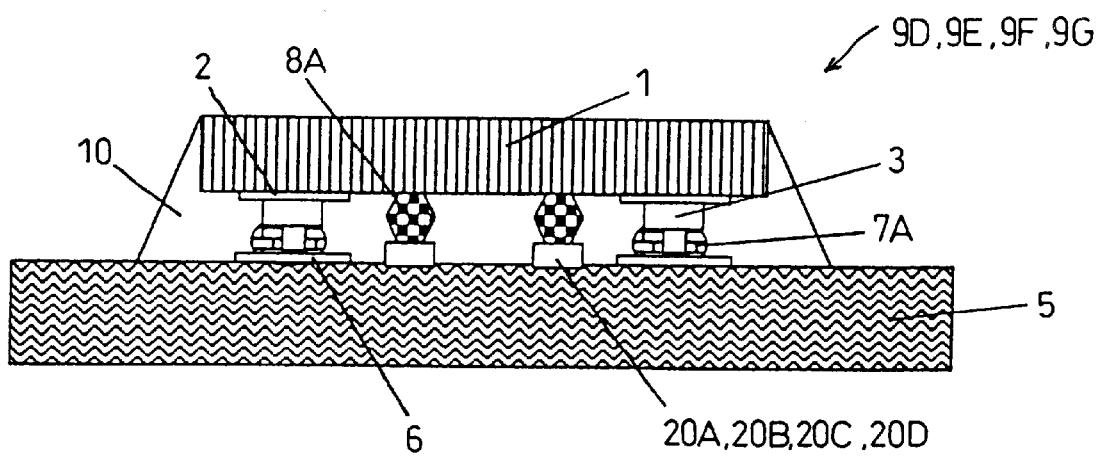

A method of producing a mounting structure 9E of embodiment 5 will be described with reference to FIGS. 2A and 2B. Referring to FIG. 2A, bump electrodes 3 (electrical connecting points) are formed by a known method on electrode pads 2 of an IC board 1 constituting a semiconductor device, 4. Then, a peeling permitting layer 20B is formed in a region which is not involved in electrical conduction and which is located on at least one of the semiconductor board 4 and a circuit board 5 for mounting the semiconductor device 4 thereon. In FIG. 2A, the peeling permitting layer 20B s formed on the circuit board 5 side. The peeling permitting layer 20B is. constructed with a substance that reacts with a solvent to swell and lower the bonding strength thereof. In embodiment 5, a methacrylic resin that swells with acetone is used as the peeling permitting layer 20B. However, it is possible to use another substance that swells with a solvent.

Thereafter, an electrically conductive adhesive 7A is supplied onto either one of input/output terminal electrodes 6 of the circuit board 5 and the bump electrodes 3 of the semiconductor device 4. In FIG. 2A, the electrically conductive adhesive 7A is supplied to the bump electrode 3 side. The electrically conductive adhesive 7A comprises a thermoplastic resin having a low bonding strength.

Subsequently, an adhesive 8A is supplied onto either one of the peeling permitting layer 20B of the circuit board 5 and a rear surface of the semiconductor device 4 facing the peeling permitting layer 20B. In FIG. 2A, the adhesive 8A is supplied to the semiconductor device 4 side. The adhesive 8A comprises a thermosetting epoxy resin having a high bonding strength. As a supplying method, an adhesive 8A in a liquid state may be supplied by means of a dispenser or alternatively an adhesive 8A made into a film may be supplied by the transfer method or the like.

Thereafter, the semiconductor device 4 is flip-chip mounted onto the circuit board 5 by a known method. Then, the electrically conductive adhesive 7A and the adhesive 8A are cured to form a provisional mounting structure 9'. In embodiment 5, electrical connection between the semiconductor device 4 and the circuit board 5 is established by means of the electrically conductive thermoplastic adhesive 7A having a low bonding strength. However, it is also effective to use an electrically conductive adhesive comprising a thermosetting resin having a lower strength than the adhesive 8A.

An electrical property test is conducted on the above-mentioned provisional mounting structure 9' and, if good results are obtained, a sealing resin 10 is injected into a gap between the semiconductor device 4 and the circuit board 5 for curing. This completes a mounting structure 9E (See FIG. 2B).

On the other hand, if the electrical properties of the semiconductor device 4 or the circuit board 5 are found to be poor, the next process is carried out. Here, it is assumed that the properties of the semiconductor device 4 are found to be poor. However, the same applies if the electrical properties of the circuit board 5 are found to be poor.

A solvent containing acetone is supplied into a gap between the adhesive 8A and the peeling permitting layer 20A. This allows the peeling permitting layer 20A to be swollen so as to reduce the bonding force between the peeling permitting layer 20B and the adhesive 8A or the bonding force between the peeling permitting layer 20B and the circuit board 5. In this state, the semiconductor device 4 is separated from the circuit board 5.

Then, another semiconductor device 4 is mounted onto the circuit board 5 by a method similar to the above-described one, thereby performing a repairing work. Further, the test of electrical properties is conducted on the provisional mounting structure 9' again and, if good results are obtained, a sealing resin 10 is injected into a gap between the semiconductor device 4 and the circuit board 5 for curing. On the other hand, if good results are not obtained, the above-described repairing work is carried out again.

Thus, in embodiment 5 producing the mounting structure 9E, the same functions and effects as in embodiment 4 can be exhibited.

(Embodiment 6)

In embodiment 6, a mounting structure 9F is produced by a method basically similar to the one used in embodiment 5, except that a peeling permitting layer 20C that is foamed by heating is used. Hereafter, the method of producing the mounting structure 9F of embodiment 6 will be described with reference to FIGS. 2A and 2B.

Referring to FIG. 2A, bump electrodes 3 (electrical connecting points) are formed by a known method on electrode pads 2 of an IC board 1 constituting a semiconductor device 4. Then, a peeling permitting layer 20C is formed in a region which is not involved in electrical conduction and which is located on at least one of the semiconductor board 4 and a circuit board 5 for mounting the semiconductor device 4 thereon. In FIG. 2A, the peeling permitting layer 20C s formed on the circuit board 5 side. The peeling permitting layer 20C is constructed with a substance that is foamed by heat to lower the bonding force thereof. In embodiment 6, a butadiene rubber that is foamed by heat is used as the peeling permitting layer 20C having a peeling property. However, there is no problem in using a substance having a similar function.

Thereafter, an electrically conductive adhesive 7A is supplied onto either one of input/output terminal electrodes 6 of the circuit board 5 and the bump electrodes 3 of the semiconductor device 4. In FIG. 2A, the electrically conductive adhesive 7A is supplied to the bump electrode 3 side. The electrically conductive adhesive 7A comprises a thermoplastic resin having a low bonding strength.

Then, an adhesive 8A is supplied onto either one of the peeling permitting layer 20C of the circuit board 5 and a rear surface of the semiconductor device 4 facing the peeling permitting layer 20C. In FIG. 2A, the adhesive 8A is supplied to the semiconductor device 4 side. The adhesive 8A comprises a thermosetting epoxy resin having a high bonding strength. As a supplying method, an adhesive 8A in a liquid state may be supplied by means of a dispenser or alternatively an adhesive 8A made into a film may be supplied by the transfer method or the like.

Subsequently, the semiconductor device 4 is flip-chip mounted onto the circuit board 5 by a known method. Then, the electrically conductive adhesive 7A and the adhesive 8A are cured to form a provisional mounting structure 9'. In embodiment 6, electrical connection between the semiconductor device 4 and the circuit board 5 is established by means of the electrically conductive thermoplastic adhesive 7A having a low bonding strength. However, it is also effective to use a thermosetting resin having a lower strength than the adhesive 8A.

An electrical property test is conducted on the above-mentioned provisional mounting structure 9' and, if good results are obtained, a sealing resin 10 is injected into a gap between the semiconductor device 4 and the circuit board 5 for curing. This completes a mounting structure 9F (See FIG. 2B).

On the other hand, if the electrical properties of the semiconductor device 4 or the circuit board 5 are found to be poor, the next process is carried out. Here, it is assumed that the properties of the semiconductor device 4 are found to be poor. However, the same applies if the properties of the circuit board 5 are found to be poor.

A bonding region between the adhesive 8A and the peeling permitting layer 20C is heated up to a temperature at which the peeling permitting layer 20C is foamed. This allows the peeling permitting layer 20A to be swollen so as to reduce the bonding force between the peeling permitting layer 20C and the adhesive 8A or the bonding force between the peeling permitting layer 20C and the circuit board 5. In this state, the semiconductor device 4 is separated from the circuit board 5.

Then, another semiconductor device 4 is mounted onto the circuit board 5 by a method similar to the above-described one, thereby performing a repairing work. Further, the test of electrical properties is conducted on the provisional mounting structure 9' again and, if good results are obtained, a sealing resin 10 is injected into a gap between the semiconductor device 4 and the circuit board 5 for curing. On the other hand, if good results are not obtained, the above-described repairing work is carried out again.

Thus, in embodiment 6 producing the mounting structure 9F, the same functions and effects as in embodiment 4 can be exhibited.

(Embodiment 7)

In embodiment 7, a mounting structure 9G is produced by a method basically similar to the one used in embodiment 5, except that a peeling permitting layer 20D having a glass transition point $PG_{20D}$ lower than the glass transition point $PG_{8A}$ of the adhesive 8A ($PG_{20D} < PG_{8A}$) is used. Hereafter, the method of producing the mounting structure 9G of embodiment 7 will be described with reference to FIGS. 2A and 2B.

Referring to FIG. 2A, bump electrodes 3 (electrical connecting points) are formed by a known method on electrode pads 2 of an IC board 1 constituting a semiconductor device 4. Then, a peeling permitting layer 20D is formed in a region which is not involved in electrical conduction and which is located on at least one of the semiconductor board 4 and a circuit board 5 for mounting the semiconductor device 4 thereon. In FIG. 2A, the peeling permitting layer 20D is formed on the circuit board 5 side. The peeling permitting layer 20D is constructed with a resin having a glass transition point $PG_{20D}$ lower than the glass transition point $PG_{8A}$ (for example, 120° C.) of the later-mentioned adhesive 8A ($P_{G20D} < PG_{8A}$). Specifically, the peeling permitting layer 20D is constructed with an epoxy resin having a glass transition point PG20D of 60° C.

Thereafter, an electrically conductive adhesive 7A is supplied onto either one of input/output terminal electrodes 6 of the circuit board 5 and the bump electrodes 3 of the semiconductor device 4. In FIG. 2A, the electrically conductive adhesive 7A is supplied to the bump electrode 3 side. The electrically conductive adhesive 7A comprises a thermoplastic resin having a low bonding strength.

Then, an adhesive 8A is supplied onto either one of the peeling permitting layer 20D of the circuit board 5 and a rear surface of the semiconductor device 4 facing the peeling permitting layer 20D. In FIG. 2A, the adhesive 8A is supplied to the semiconductor device 4 side. The adhesive 8A comprises a thermosetting epoxy resin having a high bonding strength. As a supplying method, an adhesive 8A in a liquid state may be supplied by means of a dispenser or alternatively an adhesive 8A made into a film may be supplied by the transfer method or the like.

Subsequently, the semiconductor device 4 is flip-chip mounted onto the circuit board 5 by a known method. Then, the electrically conductive adhesive 7A and the adhesive 8A are cured to form a provisional mounting structure 9'. In embodiment 7, electrical connection between the semiconductor device 4 and the circuit board 5 is established by means of the electrically conductive thermoplastic adhesive 7A having a low bonding strength. However, it is also effective to use a thermosetting resin having a lower strength than the adhesive 8A.

An electrical property test is conducted on the above-mentioned provisional mounting structure 9' and, if good results are obtained, a sealing resin 10 is injected into a gap between the semiconductor device 4 and the circuit board 5 for curing. This completes a mounting structure 9G (See FIG. 2B).

On the other hand, if the electrical properties of the semiconductor device 4 or the circuit board 5 are found to be poor, the next process is carried out. Here, it is assumed that the properties of the semiconductor device 4 are found to be poor. However, the same applies if the properties of the circuit board 5 are found to be poor.

A bonding region between the adhesive 8A and the peeling permitting layer 20D is heated. The heating temperature is set as follows. Namely, the above-described heating temperature is set in a temperature region T2 which is higher than the glass transition point $PG_{20D}$ of the peeling permitting layer 20D (for example, 60° C. as mentioned above) and which is lower than the glass transition point $PG_{8A}$ of the adhesive 8A (for example, 120° C. as mentioned above) ($PG_{20D} < T2 < PG_{8A}$).

This allows the peeling permitting layer 20A to be softened so as to reduce the bonding force between the peeling permitting layer 20D and the adhesive 8A or the bonding force between the peeling permitting layer 20D and the circuit board 5. In this state, the semiconductor device 4 is separated from the circuit board 5.

Then, another semiconductor device 4 is mounted onto the circuit board 5 by a method similar to the above-described one, thereby performing a repairing work. Further, the test of electrical properties is conducted on the provisional mounting structure 9' again and, if good results are obtained, a sealing resin 10 is injected into a gap between the semiconductor device 4 and the circuit board 5 for curing. On the other hand, if good results are not obtained, the above-described repairing work is carried out again.

Thus, in embodiment 7 producing the mounting structure 9G, the same functions and effects as in embodiment 4 can be exhibited.

In the above-described embodiments 4 to 7, an adhesive 8A composed of a thermosetting resin is used as an adhesive for bonding the semiconductor device 4 and the circuit board 5. However, a similar effect can be obtained by using an adhesive composed of a low melting point metal such as a solder.

Figure 3:
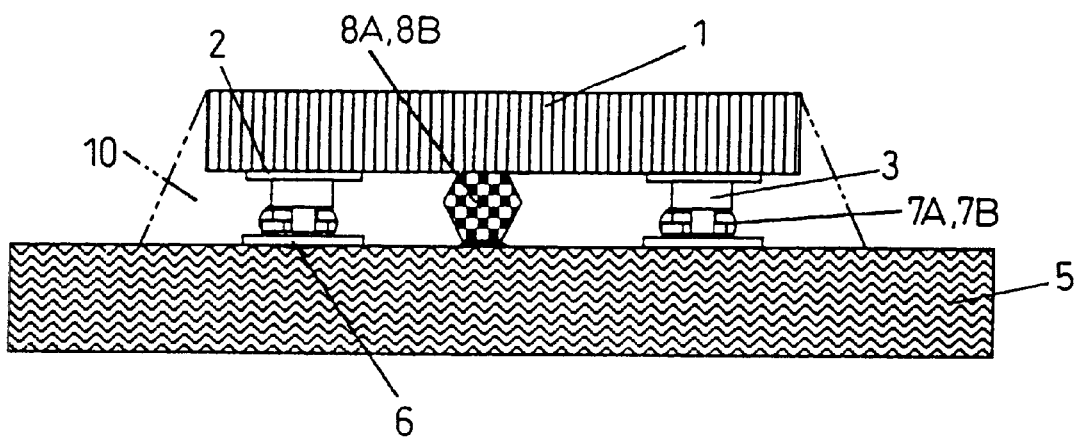
FIG. 3 is a schematic section view showing modifications of the embodiments 1, 2, and 3.

In the meantime, in the above-described embodiments 1 to 3, an adhesive 8A or 8B is disposed at a plurality of places (two places in the drawings). The semiconductor device 4 is separated from the circuit board 5 after softening these adhesives 8A, 8B by heating to weaken the bonding force thereof at the time of repairing. However, a method shown in FIG. 3 can be adopted. Namely, the adhesive 8A or 8B is disposed at a single place. At the time of repairing, the semiconductor device 4 is separated from the circuit board 5 by applying a torsional force F to the adhesive 8A, 8B along the mounting surface direction of the semiconductor device 4 after softening the adhesive 8A, 8B by a heating process. This allows the semiconductor device 4 and the circuit board 5 to be separated from each other by a smaller force. As a specific measure for applying a torsional force F to the adhesive 8A, 8B, for example, a torsional rotation may be applied to the semiconductor device 4 and the circuit board 5 along an axis perpendicular to the mounting surface direction thereof in separating the two.

For example, for a provisional mounting structure 9' in which an adhesive 8A composed of a thermosetting resin is disposed at a single place on a central portion of a rear surface of the semiconductor device 4, a force of 750 gf is needed in separating the semiconductor device 4 from the circuit board 5 by applying a shear strength near the center of the semiconductor device 4 in a state where the provisional mounting structure 9' is heated to 120° C. which is above the glass transition point $PG_{8A}$ of the adhesive 8A. In contrast, a force of only 300 gf is needed in separating the semiconductor device 4 from the circuit board 5 by applying a shear strength to a corner of the semiconductor device 4 to apply a torsional force to the adhesive 8A.

In the above-described embodiments 4 to 7, the semiconductor device 4 is separated from the circuit board 5 at the time of repairing after disposing the adhesive 8A and the fluororesin layer 20A or the peeling permitting layer 20B, 20C, 20D at a plurality of places (two places in the drawings) Here, it goes without saying that, if the peeling permitting layer 20B, 20C, 20D is disposed, the semiconductor device 4 is separated from the circuit board 5 after softening the peeling permitting layer 20B, 20C, 20D by one of various predetermined processes to weaken the bonding force thereof.

Figure 4:
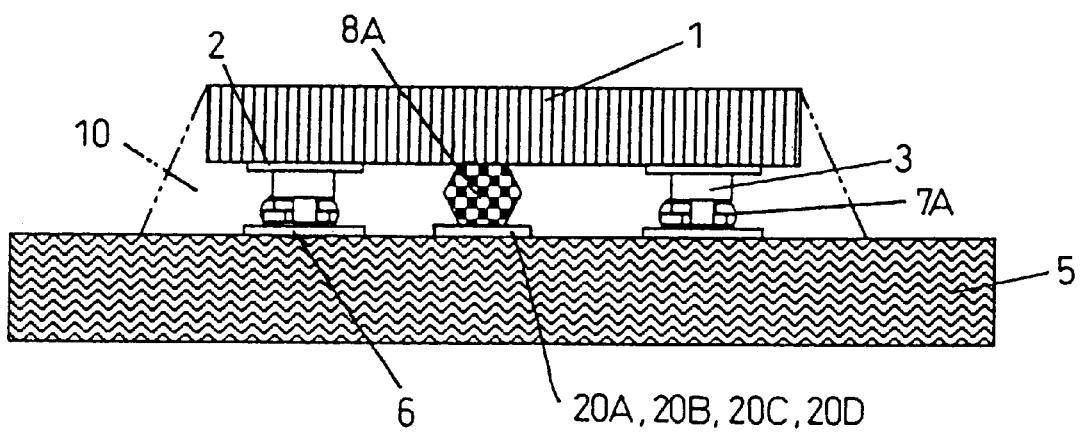
FIG. 4 is a schematic section view showing modifications of the embodiments 4, 5, 6, and 7.
Figure 5:
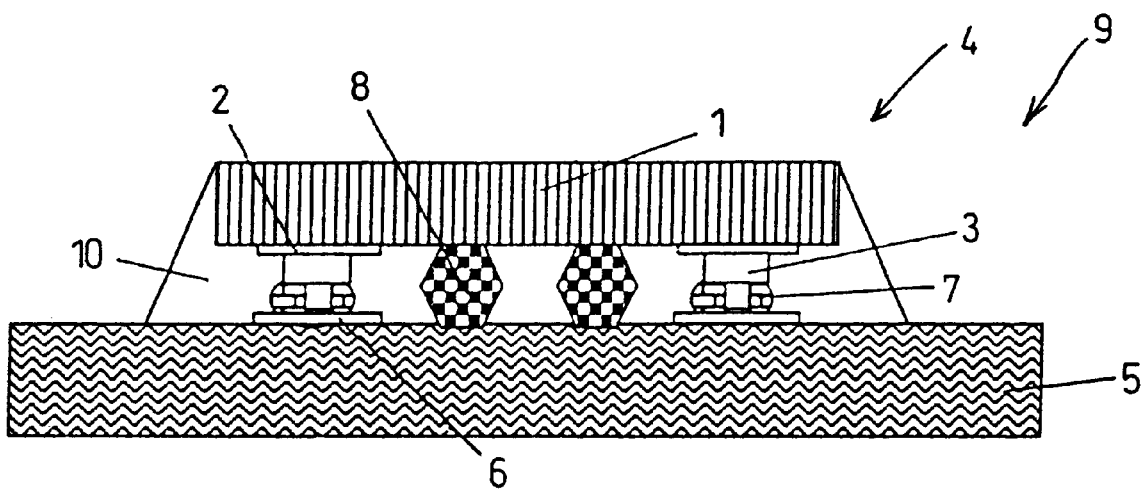
FIG. 5 is a schematic section view showing a construction of a conventional mounting structure.

However, the semiconductor device 4 maybe separated from the circuit board 5 while applying a torsional force F to the adhesive 8A along the mounting surface direction of the semiconductor device 4 and the circuit board 5 at the time of repairing after disposing the adhesive 8A and the fluororesin layer 20A or the peeling permitting layer 20B, 20C, 20D at a single place, as illustrated in FIG. 4.

This allows the semiconductor device 4 and the circuit board 5 to be separated from each other by a smaller force. Here, in this case also, it goes without saying that, if the peeling permitting layer 20B, 20C, 20D is disposed, the torsional force F is applied after softening the peeling permitting layer 20B, 20C, 20D by one of various predetermined processes.

While this invention has been described with reference to the most preferable embodiments thereof, various changes and modifications can be made to the combinations and arrangements of components for preferable embodiments without departing from the spirit and scope of this invention as defined by the appended claims.

What is claimed is:

1. A mounting structure comprising:

a semiconductor device which is flip-chip mounted on a mounting surface of a substrate;

an adhesive for bonding a region of said semiconductor device to a region of said substrate, said adhesive not contacting any components forming an electrical connection between said semiconductor device and said substrate;

a peeling permitting layer which is disposed between said adhesive and said semiconductor device and/or between said adhesive and said substrate for permitting peeling between said adhesive and said semiconductor device and/or between said adhesive and said substrate.

2. A mounting structure comprising:

a semiconductor device which is flip-chip mounted on a mounting surface of a substrate;

an adhesive for bonding a region of said semiconductor device to a region of said substrate, each of said regions not being involved in electrical connection;

a peeling permitting layer which is disposed between said adhesive and said semiconductor device and/or between said adhesive and said substrate for permitting peeling between said adhesive and said semiconductor device and/or between said adhesive and said substrate, wherein said peeling permitting layer is formed of a fluororesin that weakens a bonding of said adhesive.

3. A mounting structure according to claim 1, wherein said peeling permitting layer is formed of a substance having a bonding force that weakens by a predetermined process.

4. A mounting structure comprising:

a semiconductor device which is flip-chip mounted on a mounting surface of a substrate;

an adhesive for bonding a region of said semiconductor device to a region of said substrate, each of said regions not being involved in electrical connection;

a peeling permitting layer which is disposed between said adhesive and said semiconductor device and/or between said adhesive and said substrate for permitting peeling between said adhesive and said semiconductor device and/or between said adhesive and said substrate, wherein said peeling permitting layer is formed of a substance having a bonding force that weakens by swelling through reaction with a solvent.

5. A mounting structure comprising:

a semiconductor device which is flip-chip mounted on a mounting surface of a substrate;

an adhesive for bonding a region of said semiconductor device to a region of said substrate, each of said regions not being involved in electrical connection;

a peeling permitting layer which is disposed between said adhesive and said semiconductor device and/or between said adhesive and said substrate for permitting peeling between said adhesive and said semiconductor device and/or between said adhesive and said substrate, wherein said peeling permitting layer is formed of a substance having a bonding force that weakens by foaming through a heating process.

6. A mounting structure comprising:

a semiconductor device which is flip-chip mounted on a mounting surface of a substrate;

an adhesive for bonding a region of said semiconductor device to a region of said substrate, each of said regions not being involved in electrical connection;

a peeling permitting layer which is disposed between said adhesive and said semiconductor device and/or between said adhesive and said substrate for permitting peeling between said adhesive and said semiconductor device and/or between said adhesive and said substrate, wherein said peeling permitting layer is formed of a substance having a glass transition point or a melting point which is lower than said adhesive.

* * * * *